(12) United States Patent
Lee

(10) Patent No.: US 6,365,473 B1
(45) Date of Patent: Apr. 2, 2002

(54) METHOD OF MANUFACTURING A TRANSISTOR IN A SEMICONDUCTOR DEVICE

(75) Inventor: Jung Ho Lee, Seoul (KR)

(73) Assignee: Hyundai Electronics Industries Co. Ltd., Kyungki-do (KR)

( * ) Notice: Subject to any disclaimer, the term of this patent is extended or adjusted under 35 U.S.C. 154(b) by 1 day.

(21) Appl. No.: 09/607,107

(22) Filed: Jun. 29, 2000

(30) Foreign Application Priority Data

Jun. 29, 1999 (KR) ............................................. 99-25430

(51) Int. Cl.$^7$ ............................................. H01L 21/336
(52) U.S. Cl. ...................... 438/303; 438/304; 438/305; 438/306
(58) Field of Search ................................. 438/303, 304, 438/305, 306, 307, 308

(56) References Cited

U.S. PATENT DOCUMENTS

| | | | |
|---|---|---|---|
| 4,728,623 A | 3/1988 | Lu et al. ........................ | 437/52 |
| 4,738,937 A | 4/1988 | Parsons ........................ | 437/180 |
| 4,918,029 A | 4/1990 | Kim ........................... | 437/119 |
| 5,004,702 A | 4/1991 | Samata et al. ................. | 437/57 |
| 5,030,583 A | 7/1991 | Beetz .......................... | 437/39 |
| 5,032,538 A | 7/1991 | Bozler et al. .................. | 437/83 |
| 5,045,494 A | 9/1991 | Choi et al. .................... | 437/60 |
| 5,272,109 A | 12/1993 | Motoda ........................ | 437/129 |
| 5,322,802 A | 6/1994 | Baliga et al. .................. | 437/22 |
| 5,322,814 A | 6/1994 | Rouse et al. ................... | 437/110 |
| 5,378,652 A | 1/1995 | Samata et al. ................. | 437/189 |
| 5,432,121 A | 7/1995 | Chan et al. .................... | 437/95 |
| 5,435,856 A | 7/1995 | Rouse et al. ................... | 136/225 |
| 5,494,837 A | 2/1996 | Subramanian et al. ......... | 437/34 |
| 5,508,225 A | 4/1996 | Kadoiwa ....................... | 437/129 |
| 5,567,652 A | 10/1996 | Nishio .......................... | 437/200 |
| 5,599,724 A | 2/1997 | Yoshida ........................ | 437/40 |
| 5,627,102 A | 5/1997 | Shinriki et al. ............... | 437/192 |
| 5,633,201 A | 5/1997 | Choi ............................ | 438/620 |
| 5,744,377 A | 4/1998 | Sekiguchi et al. ............ | 438/674 |
| 5,767,557 A | * 6/1998 | Sultan et al. ................. | 257/403 |
| 5,773,350 A | 6/1998 | Herbert et al. ................ | 438/364 |
| 5,804,470 A | 9/1998 | Wollesen ...................... | 438/141 |
| 5,821,147 A | * 10/1998 | Kizilyalli ..................... | 438/305 |
| 6,063,682 A | * 5/2000 | Kizilyalli ..................... | 438/305 |

FOREIGN PATENT DOCUMENTS

| | | |
|---|---|---|
| JP | 54-158880 | 12/1979 |
| JP | 2-37745 | 2/1990 |
| JP | 2-260667 | 10/1990 |
| JP | 8-236728 | 9/1996 |
| JP | 10-107219 | 4/1998 |
| JP | 11-97519 | 4/1999 |

\* cited by examiner

*Primary Examiner*—David Nelms
*Assistant Examiner*—Dung A. Le
(74) *Attorney, Agent, or Firm*—Pennie & Edmonds LLP

(57) ABSTRACT

There is disclosed a method of manufacturing a transistor in a semiconductor device by which, when forming an elevated channel using an epitaxy technology for further expanding the applied region of a buried channel PMOS transistor, indium ions having the high amount of atoms and a low diffusion speed after growth of an epitaxial layer are implanted to distribute them into a boron epitaxial layer and a lower portion. Thus, it can obtain a desired threshold voltage Vt in a device and can improve degradation in a short channel.

20 Claims, 3 Drawing Sheets

METHOD OF MANUFACTURING A TRANSISTOR IN A SEMICONDUCTOR DEVICE

BACKGROUND OF THE INVENTION

1. Field of the Invention

The invention relates generally to a method of manufacturing a transistor in a semiconductor device. More particularly, the present invention relates to a method of manufacturing a transistor in a semiconductor device by which, when forming an elevated channel using an epitaxy technology for further expanding the applied region of a buried channel PMOS transistor, indium ions having the high amount of atoms and a low diffusion speed after growth of an epitaxial layer are implanted to distribute them into a boron epitaxial layer and a lower portion. Thus, it can obtain a desired threshold voltage (Vt) in a device and can improve degradation in a short channel.

2. Description of the Prior Art

Generally, in order for the applied region of the buried channel PMOS transistor to be expanded further, a transistor of a semiconductor device having an elevated channel is employed using an epitaxy technology.

FIGS. 1A through 1C are sectional views for illustrating a method of manufacturing a transistor in a conventional semiconductor device.

Referring now to FIG. 1A, a device separation film 2 is formed on a silicon substrate 1, and an N-well 3 is formed on it in order to form a PMOS transistor.

Referring to FIG. 1B, an epitaxial layer 4 into which boron is doped, is formed only at the portion in which the silicon substrate 1 is exposed using selective epi-silicon growth (SEG) process. Then, a gate oxide film 5, a gate electrode 6 and a mask insulating film 7 are sequentially formed on the epitaxial layer 4 in a stacked pattern.

Referring to FIG. 1C, a gate spacer 8 is formed at both sides of the pattern in which the gate electrode 6 is included. Next, source/drain ion implantation process and annealing process for activating implanted dopents are sequentially performed to form a source/drain junction 9, thus defining a boron-doped channel epitaxial layer 4a under the gate electrode 6.

As mentioned above, as the conventional boron-doped channel epitaxial layer 4a requires consumption of the silicon substrate 1 when forming the gate oxide film 5, the channel epitaxial layer 4a is consumed about 30 Angstrom. Also, as loss of boron into the gate oxide film 5 is occurred, a doping profile similar to a square shape initially is gradually formed at the interface with the gate oxide film 5. However, in order to prevent it, if the thickness of the gate oxide film 5 becomes thicker, the portion in which the channel is formed becomes deeper. Also, in order to compensate for this loss of boron, if the doping concentration becomes higher exceeding a desired level, a capture phenomenon of channel boron is strongly occurred around the crystal defects of dislocation etc. that is necessarily formed when implanting ions at a higher concentration for forming the junction of the device. As well known in the art. Thus, it causes a problem that the phenomenon of degrading the threshold voltage (Vt) characteristic in the device such as a reverse short channel effect is significant toward the short channel.

SUMMARY OF THE INVENTION

It is therefore an object of the present invention to provide a method of manufacturing a transistor in a semiconductor device by which, when forming an elevated channel using an epitaxy technology for further expanding the applied region of a buried channel PMOS transistor, indium ions having the high mount of atoms and a low diffusion speed after growth of an epitaxial layer are implanted to distribute them into a boron epitaxial layer and a lower portion. Thus, it can obtain a desired threshold voltage (Vt) in a device and can improve degradation in a short channel.

A method of manufacturing a transistor in a semiconductor device according to the present invention is characterized in that it comprises the step of forming a device separation film on a silicon substrate and then forming a N-well; after performing cleaning process, forming an epitaxial layer in which boron is selectively doped only into the portion in which said silicon substrate is exposed; implanting indium ions into said epitaxial layer to form a boron-indium doped epitaxial layer; forming a pattern in which a gate oxide film, a gate electrode and a mask insulating film are stacked on said boron-indium doped epitaxial layer; and forming a gate spacer at both sides of the pattern in which said gate electrode is included, and then sequentially performing source/drain ion implantation process and annealing process for activating the implanted dopents.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
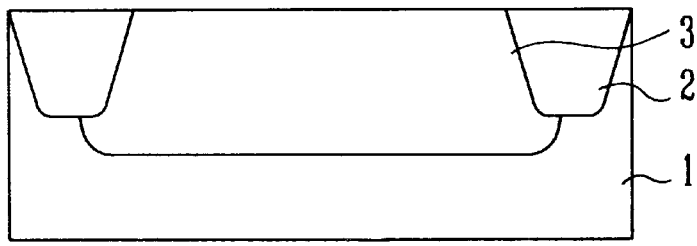
FIGS. 1A through 1C are sectional views for illustrating a method of manufacturing a transistor in a conventional semiconductor device.
Figure 1B:
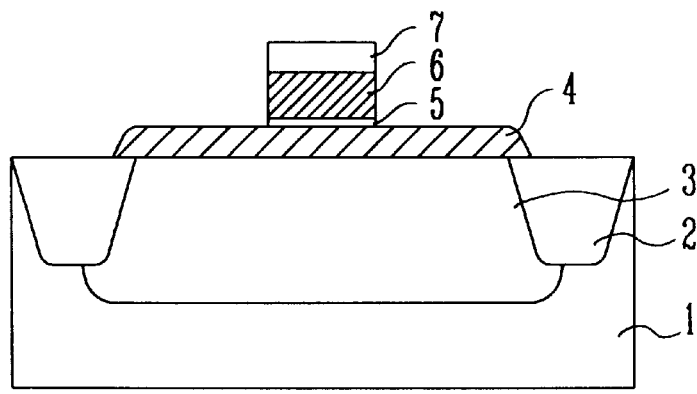
Figure 1C:
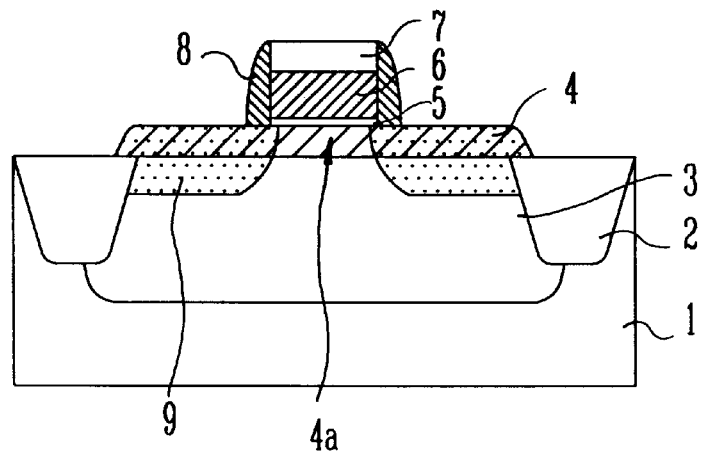

The present invention will be described in detail by way of a preferred embodiment with reference to accompanying drawings, in which like reference numerals are used to identify the same or similar parts.

FIGS. 2A through 2D are sectional views for illustrating a method of manufacturing a transistor in a semiconductor device according to one embodiment of the present invention.

Figure 2A:
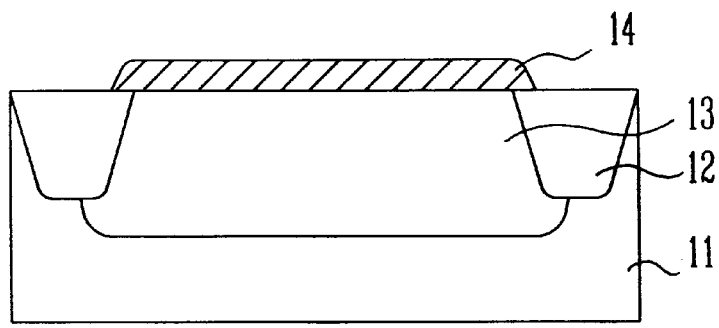
FIGS. 2A through 2D are sectional views for illustrating a method of manufacturing a transistor in a semiconductor device according to one embodiment of the present invention.

Referring now to FIG. 2A, a device separation film 12 is formed on a silicon substrate 11, and an N-well 13 is formed on it in order to form a PMOS transistor. Next, a native oxide film is removed by cleaning process. Then, an epitaxial layer 14 into which boron is doped, is formed only at the portion in which the silicon substrate 11 is exposed using in-situ boron-doped selective epi-silicon growth (SEG) process.

In the above, the N-well 13 must be formed by activating dopents by means of annealing process including the temperature of 950° C. for about 30 minutes in a reactive furnace after phosphorous of dose of 1E13 through 3E13 ions/cm$^2$ is implanted at a ion implantation energy of 800 through 1200 KeV.

The cleaning process may include ex-situ cleaning process and in-situ cleaning process that is performed within the epitaxial silicon equipment. The ex-situ cleaning process may include a RCA cleaning or a mixture of an UV ozone cleaning and a HF dipping. The ex-situ cleaning may include performing a hydrogen bake of 800 through 900° C. for 1 through 5 minutes before forming the epitaxial layer 14, in order to prevent generation of the oxide film.

The selective epi-silicon growth process using an ultra high vacuum chemical vapor deposition (UHVCVD) method or a low pressure chemical vapor deposition (LPCVD) method may be performed to form the epitaxial layer 14 into which boron is doped, in thickness of 100 through 500 Angstrom, only at the portion in which the surface of the silicon substrate 11 is exposed. At this time, the doping concentration is 3E12 through 1E14 ions/cm$^2$. In case of a low pressure chemical vapor deposition method in the selective epi-silicon growth process, the deposition gas uses DCS and HCl, DCS is 30 through 300 sccm upon deposition, $B_2H_6$ is flowed together about 100 through 300 sccm for boron doping, the deposition pressure is about 10 through 50 Torr and the deposition temperature is 750 through 950° C.

In case of an ultra high vacuum chemical vapor deposition method, the deposition gas uses $SiH_4$ or $Si_2H_6$, $B_2H_6$ is flowed together about 100 through 300 sccm for boron doping, the deposition pressure is less than 1 Torr and the deposition temperature is 600 through 700° C.

Figure 2B:
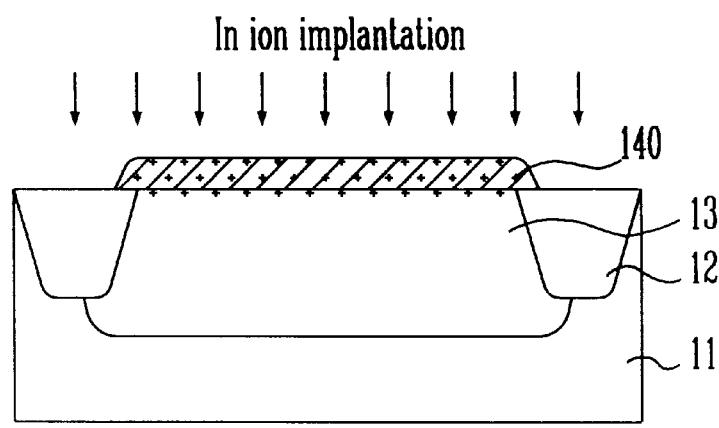

Referring now to FIG. 2B, indium ions are implanted into the epitaxial layer 14 into which boron is doped to form a boron-indium doped epitaxial layer 140.

In the above, the boron-indium doped epitaxial layer 140 is formed by implanting indium of dose of 1E12 through 5E13 ions/cm$^2$ at a ion implantation energy of 10 through 40 KeV. At this time, indium to be implanted is also doped into the surface of the underlying silicon substrate 11.

Figure 2C:
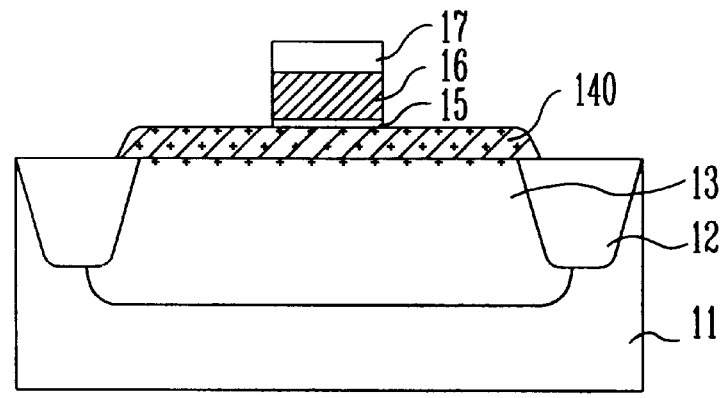

Referring to FIG. 2C, a gate oxide film 15, a gate electrode 16 and a mask insulating film 17 are sequentially formed on the boron-indium doped epitaxial layer 140 in a stacked pattern.

Figure 2D:
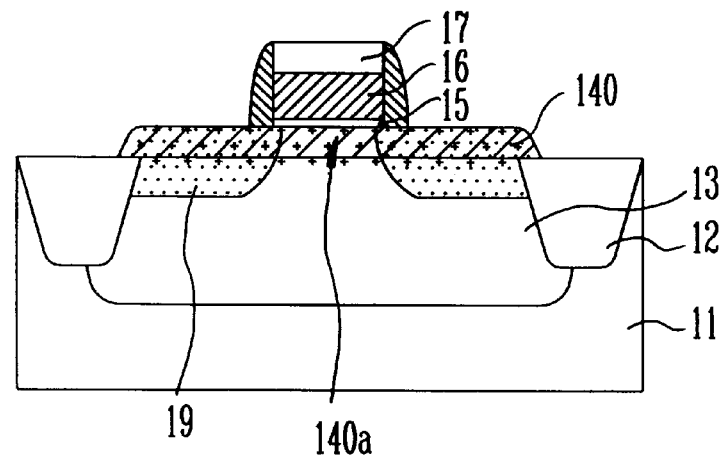

Referring to FIG. 2D, a gate spacer 18 is formed at both sides of the pattern in which the gate electrode 16 is included. Next, source/drain ion implantation process and annealing process for activating the implanted dopents are sequentially performed to form a source/drain junction 19, thus defining a boron-indium doped channel epitaxial layer 140a under the gate electrode 16.

In the above, the ion implantation for forming the source/drain junction 19 uses the dopents in the form of the mixture ion implantation of $BF_2$ or $BF_2/B$. At this time, $BF_2$ is implanted with the dose of 1E15 through 3E15 ions/cm$^2$ at the energy of 10 through 40 KeV, and $BF_2/B$ is implanted with the dose of 1E15 through 3E15 ions/cm$^2$ at the energy of 1 through 5 KeV.

The annealing process may include a reactive furnace annealing process or a rapid annealing (TRA) process. The reactive furnace annealing process is performed under the atmosphere of $N_2$ at the temperature of 800 through 950° C. for 10 through 30 minutes. Also, the rapid annealing (TRA) process is performed under the atmosphere of $N_2$ or $NH_3$ at the temperature of 900 through 1050° C. for 1 through 30 seconds, and its elevated temperature is 30 through 200° C. per second.

The embodiment of the present invention is to improve the method of manufacturing a buried channel PMOS transistor using the existing epi channel. Thus, it can prohibit at a maximum the increase of the thickness of the epitaxial layer and the doping concentration of boron to prevent loss of boron accompanied by formation of the gate oxide film upon and during a subsequent annealing process. Also, it can improve the threshold voltage (Vt) and the short channel characteristic in the long channel by doping indium in which the reverse short effect etc. is rarely occurred into the epitaxial layer and its underlying portion. As a result that indium is applied to a conventional structure to which the channel epitaxy is not applied, it represents an incomplete ionization state at a room temperature if its implanted doping concentration is a little high, and has a very low solid solubility, as shown in the graph of FIG. 3. Thus, the amount of indium existing in a state in which it is activated in silicon is very small. Therefore, it is impossible to control the threshold voltage of the PMOS with only indium. Further, indium can compensate for loss of boron and can improve the characteristic in the short channel without a capture phenomenon around the crystal defects due to high amount of atom. Thus, if indium is used with mixed with boron, it can obtain a very efficient device characteristic.

Figure 3A:
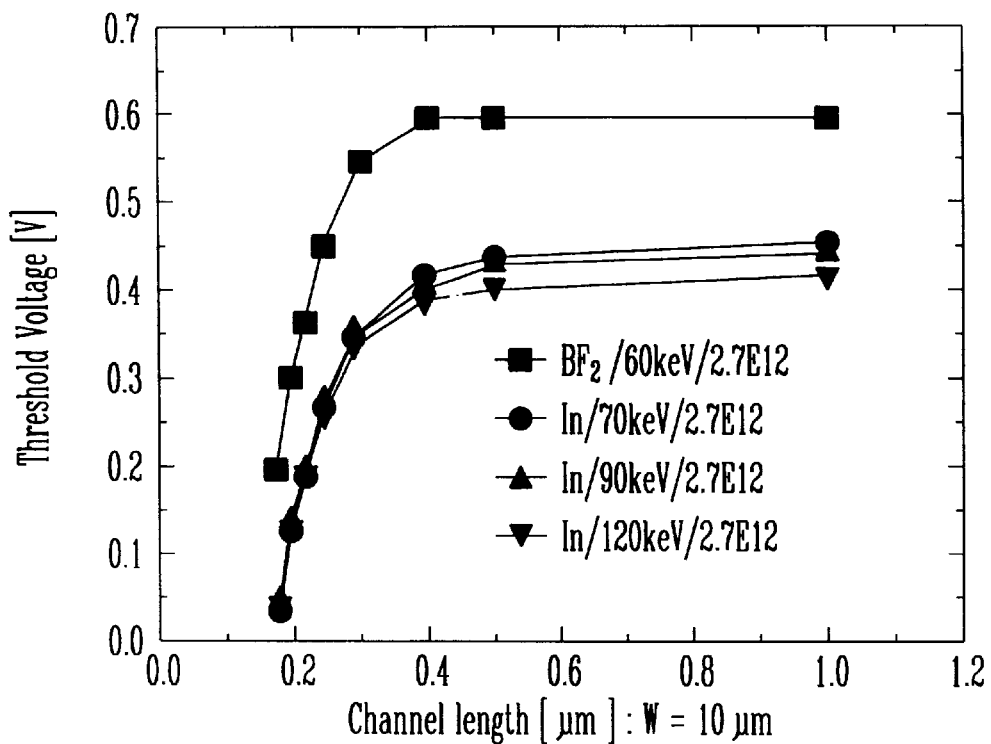
FIGS. 3A and 3B are graphs for explaining the device characteristic of the present invention.

FIG. 3a is a graph for explaining the device characteristic of the present invention. From the graph, it can be first seen that the threshold voltage becomes lowered compared to $BF_2$ doping due to incomplete ionization at a room temperature a low solid solubility when only indium is applied. Next, in case of indium doping, the threshold voltage (Vt) roll-off phenomenon is improved toward the short channel compared to $BF_2$ doping.

Figure 3B:
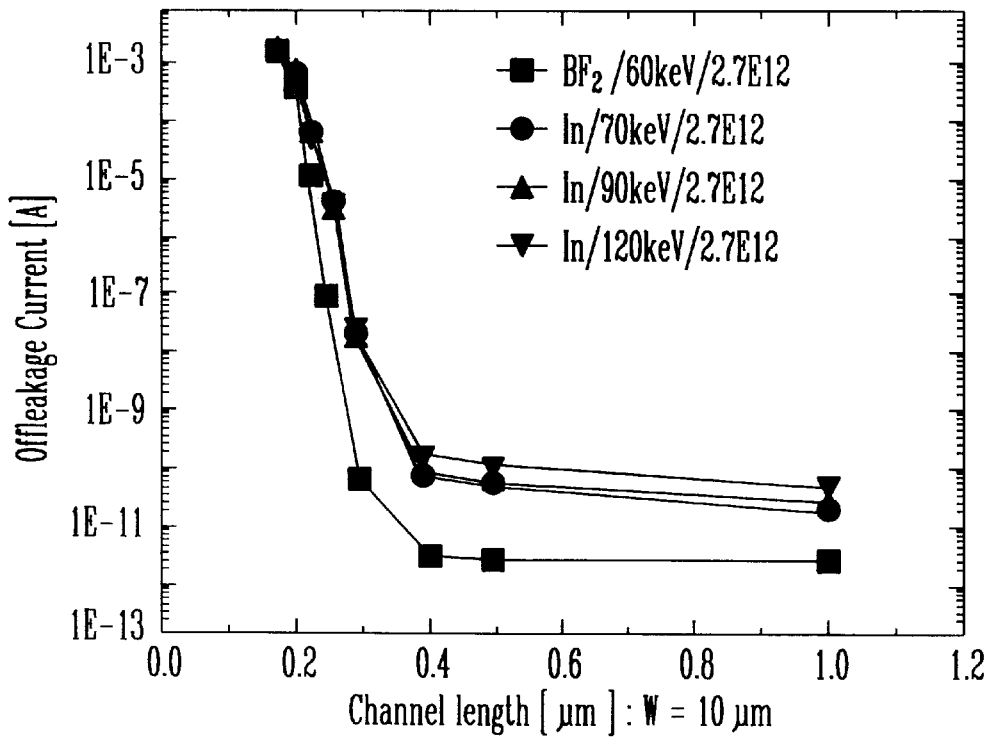

FIG. 3b shows a graph in which the off leakage current characteristic, which is very degraded compared to $BF_2$, in the long channel, is almost same to $BF_2$ in the short channel. It implies that if the threshold voltage in the long channel is similarly matched to $BF_2$, an improved short channel effect can be obtained when indium is applied.

As mentioned above, the conventional method has the following drawbacks that the channel boron is easily captured to the crystal defects etc. that are formed by ion implantation process for forming a device junction upon a subsequent annealing process, the short channel characteristic of a device such as a reverse short channel effect etc. is degraded, and boron is easily diffused, thus making difficult to obtain a desired threshold voltage (Vt).

However, the present invention overcomes the above conventional problems by forming an epitaxial layer in-situ boron doped in thin thickness on a silicon surface after forming a device separation film and a well, and then implanting indium ions having a high amount of atoms and a low diffusion speed to distribute them into a boron epi layer and an underlying portion, using a selective epi-silicon growth technology. Thus, the present invention has outstanding effects that it can obtain a desired threshold voltage from the device more than 0.13 μm and that it can improve degradation in the short channel.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a transistor in a semiconductor device, comprising the steps of:

forming a device separation film on a silicon substrate and then forming a N-well;

after performing a cleaning process, forming an epitaxial layer in which boron is selectively doped only into the portion in which said silicon substrate is exposed;

implanting indium ions into said epitaxial layer to form a boron-indium doped epitaxial layer;

forming a pattern in which a gate oxide film, a gate electrode and a mask insulating film are stacked on said boron-indium doped epitaxial layer; and forming a gate spacer at both sides of the pattern in which said gate electrode is included, and then sequentially performing source/drain ion implantation process and annealing process for activating the implanted dopants;

wherein said cleaning process includes ex-situ cleaning process and in-situ cleaning process performed within the epitaxial silicon equipment.

2. The method of manufacturing a transistor in a semiconductor device according to claim 1, wherein said N-well is formed by activating dopants by means of annealing process including the temperature of 950° C. for about 30 minutes in a reactive furnace after implanting phosphorous of dose of 1E13 to 3E13 ions/cm$^2$ at the ion implantation energy of 800 through 1200 KeV.

3. The method of manufacturing a transistor in a semiconductor device according to claim 1, wherein said ex-situ cleaning process includes a RCA cleaning or a mixture of UV ozone cleaning and HF dipping.

4. The method of manufacturing a transistor in a semiconductor device according to claim 1, wherein said in-situ cleaning performs a hydrogen bake of 800 through 900° C. for 1 through 5 minutes before said boron forms a doped epitaxial layer in order to prevent generating an oxidization film.

5. The method of manufacturing a transistor in a semiconductor device according to claim 1, wherein said epitaxial layer into which boron is doped, is formed in thickness of 100 through 500 Angstroms, by in-situ boron doped selective epitaxial silicon growth process, using an ultra high vacuum chemical vapor deposition (UHVCVD) method or a low pressure chemical vapor deposition (LPCVD) method and wherein the boron doping concentration in 3E12 through 1E14 ions/cm$^2$.

6. The method of manufacturing a transistor in a semiconductor device according to claim 5, when forming said boron doped epitaxial layer using a low pressure chemical vapor deposition method, the deposition gas uses DCS and HCl, DCS is 30 through 300 sccm upon deposition, HCl is 30 through 200 sccm, $B_2H_6$ is flowed together about 100 through 300 sccm for boron doping, the deposition pressure is about 10 through 50 Torr and the deposition temperature is 750 through 950° C.

7. The method of manufacturing a transistor in a semiconductor device according to claim 5, wherein when forming said boron doped epitaxial layer using an ultra high vacuum chemical vapor deposition method, the deposition gas uses $SiH_4$ of $Si_2H_6$, $B_2H_6$ is flowed together about 100 through 300 sccm for boron doping, the deposition pressure is less than 1 Torr and the deposition temperature is 600 through 700° C.

8. The method of manufacturing a transistor in a semiconductor device according to claim 1, wherein the implantation for forming said source/drain junction uses the dopants in the form of the mixture ion implantation of $BF_2$ of $BF_2$/B, wherein $BF_2$ is implanted with the dose of 1E15 through 3E15 ions/cm$^2$ at the energy of 10 through 40 KeV and $BF_2$/B is implanted with the dose of 1E15 through 3E15 ions/cm$^2$ at the energy of 1 through 5 KeV.

9. The method of manufacturing a transistor in a semiconductor device according to claim 1, wherein said annealing process is performed under the atmosphere of $N_2$ at the temperature of 800 through 950° C. for 10 through 30 minutes.

10. The method of manufacturing a transistor in a semiconductor device according to claim 1, wherein said annealing process is a RTA under the atmosphere of $N_2$ or $NH_3$ at the temperature of 900 through 1050° C. for 1 through 30 seconds and wherein its elevated temperature is 30 through 200° C. per second.

11. A method of manufacturing a transistor in a semiconductor device, comprising the steps of:

forming a device separation film on a silicon substrate and then forming a N-well;

after performing a cleaning process, forming an epitaxial layer in which boron is selectively doped only into the portion in which said silicon substrate is exposed;

implanting indium ions into said epitaxial layer to form a boron-indium doped epitaxial layer;

forming a pattern in which a gate oxide film, a gate electrode and a mask insulating film are stacked on said boron-indium doped epitaxial layer; and forming a gate spacer at both sides of the pattern in which said gate electrode is included, and then sequentially performing source/drain ion implantation process and annealing process for activating the implanted dopants;

wherein said epitaxial layer into which boron is doped, is formed in thickness of 100 through 500 Angstroms, by in-situ boron doped selective epitaxial silicon growth process, using an ultra high vacuum chemical vapor deposition (UHVCVD) method or a low pressure chemical vapor deposition (LPCVD) method and wherein the boron doping concentration in 3E12 through 1E14 ions/cm$^2$.

12. The method of manufacturing a transistor in a semiconductor device according to claim 11, wherein when forming said boron doped epitaxial layer using a low pressure chemical vapor deposition method, the deposition gas uses DCS and HCl, DCS is 30 through 300 sccm upon deposition, HCl is 30 through 200 sccm, $B_2H_6$ is flowed together about 100 through 300 sccm for boron doping, the deposition pressure is about 10 through 50 Torr and the deposition temperature is 750 through 950° C.

13. The method of manufacturing a transistor in a semiconductor device according to claim 11, wherein when forming said boron doped epitaxial layer using an ultra high vacuum chemical vapor deposition method, the deposition gas uses $SiH_4$ or $Si_2H_6$, $B_2H_6$ is flowed together about 100 through 300 sccm for boron doping, the deposition pressure is less than 1 Torr and the deposition temperature is 600 through 700° C.

14. A method of manufacturing a transistor in a semiconductor device, comprising the steps of:

forming a device separation film on a silicon substrate and then forming a N-well;

after performing a cleaning process, forming an epitaxial layer in which boron is selectively doped only into the portion in which said silicon substrate is exposed;

implanting indium ions into said epitaxial layer to form a boron-indium doped epitaxial layer;

forming a pattern in which a gate oxide film, a gate electrode and a mask insulating film are stacked on said boron-indium doped epitaxial layer; and forming a gate spacer at both sides of the pattern in which said gate electrode is included, and then sequentially performing source/drain ion implantation process and annealing process for activating the implanted dopants;

wherein said boron-indium doped epitaxial layer is formed by implanting indium of dose of 1E12 to 5E13 ions/cm$^2$ at the ion implantation energy of 10 through 40 KeV.

15. A method of manufacturing a transistor in a semiconductor device, comprising the steps of:

forming a device separation film on a silicon substrate and then forming a N-well;

after performing a cleaning process, forming an epitaxial layer in which boron is selectively doped only into the portion in which said silicon substrate is exposed;

implanting indium ions into said epitaxial layer to form a boron-indium doped epitaxial layer;

forming a pattern in which a gate oxide film, a gate electrode and a mask insulating film are stacked on said boron-indium doped epitaxial layer; and forming a gate spacer at both sides of the pattern in which said gate electrode is included, and then sequentially performing source/drain ion implantation process and annealing process for activating the implanted dopants;

wherein the implantation for forming said source/drain junction uses the dopants in the form of the mixture ion implantation of $BF_2$ of $BF_2/B$, wherein $BF_2$ is implanted with the dose of 1E15 through 3E15 ions/$cm^2$ at the energy of 10 through 40 KeV and $BF_2/B$ is implanted with the dose of 1E15 through 3E15 ions/$cm^2$ at the energy of 1 through 5 KeV.

16. A method of manufacturing a transistor in a semiconductor device, comprising the steps of:

forming a device separation film on a silicon substrate and then forming a N-well;

after performing a cleaning process, forming an epitaxial layer in which boron is selectively doped only into the portion in which said silicon substrate is exposed;

implanting indium ions into said epitaxial layer to form a boron-indium doped epitaxial layer;

forming a pattern in which a gate oxide film, a gate electrode and a mask insulating film are stacked on said boron-indium doped epitaxial layer; and forming a gate spacer at both sides of the pattern in which said gate electrode is included, and then sequentially performing source/drain ion implantation process and annealing process for activating the implanted dopants;

wherein said annealing process is performed under the atmosphere of $N_2$ at the temperature of 800 through 950° C. for 10 through 30 minutes.

17. A method of manufacturing a transistor in a semiconductor device, comprising the steps of:

forming a device separation film on a silicon substrate and then forming a N-well;

after performing a cleaning process, forming an epitaxial layer in which boron is selectively doped only into the portion in which said silicon substrate is exposed;

implanting indium ions into said epitaxial layer to form a boron-indium doped epitaxial layer;

forming a pattern in which a gate oxide film, a gate electrode and a mask insulating film are stacked on said boron-indium doped epitaxial layer; and forming a gate spacer at both sides of the pattern in which said gate electrode is included, and then sequentially performing source/drain ion implantation process and annealing process for activating the implanted dopants;

wherein said annealing process is a RTA under the atmosphere of $N_2$ or $NH_3$ at the temperature of 900 through 1050° C. for 1 through 30 seconds and wherein its elevated temperature is 30 through 200° C. per second.

18. A method of manufacturing a transistor, comprising the steps of:

providing a semiconductor substrate, forming a device separation film and then a well in said semiconductor substrate;

performing a cleaning process;

forming an epitaxial layer doped with boron on an exposed portion of the semiconductor substrate;

implanting indium ions into said epitaxial layer to form a boron-indium doped epitaxial layer;

forming a gate oxide film, a gate electrode, and an insulation layer stacked on said boron-indium doped epitaxial layer; and performing source/drain ion implantation process and then an annealing process to activate implanted dopants;

wherein the cleaning process includes an ex-situ cleaning process and an in-situ cleaning process performed while the semiconductor substrate is within equipment used to form said epitaxial layer.

19. The method of manufacturing a transistor according to claim 18, wherein said epitaxial layer into which boron is doped, is formed in thickness of 100 through 500 Angstroms, by in-situ boron doped selective epitaxial silicon growth process, using an ultra high vacuum chemical vapor deposition (UHVCVD) method or a low pressure chemical vapor deposition (LPCVD) method and wherein the boron doping concentration in 3E12 through 1E14 ions/$cm^2$.

20. The method of manufacturing a transistor according to claim 18, wherein said annealing process is performed under the atmosphere of $N_2$ at the temperature of 800 through 950° C. for 10 through 30 minutes.

* * * * *